(12) United States Patent
Toshikawa et al.

(10) Patent No.: US 6,624,094 B2
(45) Date of Patent: Sep. 23, 2003

(54) METHOD OF MANUFACTURING AN INTERLAYER DIELECTRIC FILM USING VACUUM ULTRAVIOLET CVD WITH XE$_2$ EXCIMER LAMP AND SILICON ATOMS

(75) Inventors: Kiyohiko Toshikawa, Miyazaki (JP); Yoshikazu Motoyama, Miyazaki (JP); Yousuke Motokawa, Miyazaki (JP); Yusuke Yagi, Miyazaki (JP); Junichi Miyano, Miyazaki (JP); Tetsurou Yokoyama, Miyazaki (JP); Yutaka Ichiki, Miyazaki (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 0 days.

(21) Appl. No.: 09/833,646

(22) Filed: Apr. 13, 2001

(65) Prior Publication Data

US 2002/0028587 A1 Mar. 7, 2002

(30) Foreign Application Priority Data

Aug. 30, 2000 (JP) ......................... 2000/260358

(51) Int. Cl.$^7$ ............................... H01L 21/31
(52) U.S. Cl. ................. 438/788; 438/771; 438/778; 438/793
(58) Field of Search ................. 438/788, 792, 438/793, 771, 772, 778, 781

(56) References Cited

U.S. PATENT DOCUMENTS 5,387,546 A * 2/1995 Maeda et al. ............... 437/174
5,698,472 A * 12/1997 Harris .......................... 437/239

FOREIGN PATENT DOCUMENTS

| JP | 63-105970 | 5/1988 |
| JP | 06-097158 | 8/1994 |
| JP | 2001-274155 | 5/2001 |

* cited by examiner

Primary Examiner—Carl Whitehead, Jr.
Assistant Examiner—Yennhu B Huynh
(74) Attorney, Agent, or Firm—Venable, LLP; Robert J. Frank; Ashley J. Wells

(57) ABSTRACT

A method of manufacturing an interlayer dielectric film by vacuum ultraviolet CVD including the steps of placing a wafer in a vacuum chamber having a window; causing a first gas that contains silicon atoms to flow through the vacuum chamber; exposing the wafer to light emitted from a Xe$_2$ excimer lamp through the window; and maintaining an atmosphere in the chamber at a first temperature which is less than 350° C. to form an insulating film on the wafer which substantially fills stepped portions of the wafer to provide step coverage and which has a substantially flat top surface.

11 Claims, 5 Drawing Sheets

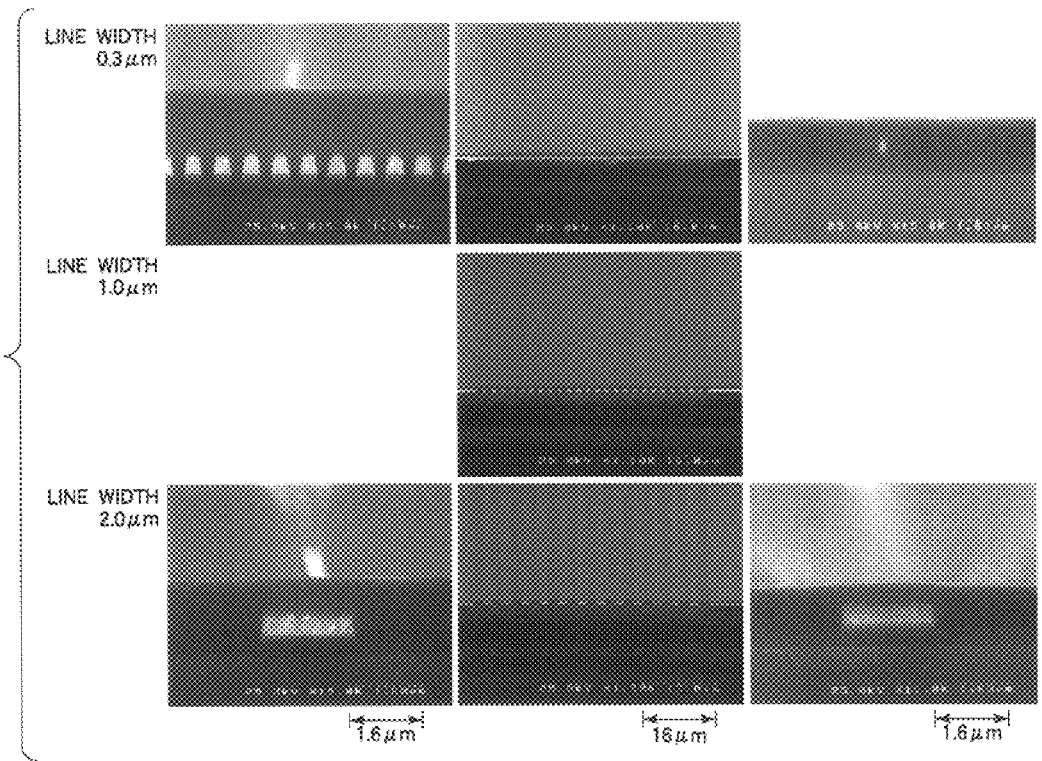

METHOD OF MANUFACTURING AN INTERLAYER DIELECTRIC FILM USING VACUUM ULTRAVIOLET CVD WITH XE$_2$ EXCIMER LAMP AND SILICON ATOMS

BACKGROUND OF THE INVENTION

1. Field of the Invention

The present invention relates to a method of manufacturing an interlayer dielectric film using vacuum ultraviolet CVD.

2. Description of the Related Art

Conventional interlayer dielectric films for use in DRAMS and Logic LSIs are formed by a plasma CVD, a thermal CVD, an oxide, and an O$_3$-CVD by using TEOS (tetra ethyl ortho silicate) as a material gas or source gas.

The aforementioned methods involve thermal treatment at a temperature higher than 700° C. when an interlayer dielectric film is formed by thermal CVD, and at a temperature higher than 350° C. when an interlayer dielectric film is formed by plasma CVD.

In addition, plasma discharge occurs when plasma CVD is used. Thermal treatment at high temperature and plasma damage the elements that form an insulating film. With increasing micro fabrication and multi-layered wiring of semiconductor devices, the adverse effects of the conventional method cannot be ignored in manufacturing reliable semiconductor devices. When an interlayer dielectric film is formed by thermal CVD or plasma CVD, the interlayer dielectric film is configured to the stepped structure immediately below the interlayer dielectric film, so that the resulting interlayer dielectric does not have a good step coverage effect as required of an interlayer dielectric film.

SUMMARY OF THE INVENTION

The present invention was made in view of the aforementioned drawbacks of the conventional art.

An object of the invention is to provide a vacuum ultraviolet CVD method of forming a flat interlayer dielectric film and having a good step coverage, in which method the interlayer dielectric film is formed at a temperature lower than 350° C. by using an organic source such as TEOS (tetra ethyl ortho silicate) that contains silicon therein.

A method of manufacturing an interlayer dielectric film having a flat top surface and a good step coverage effect by a vacuum ultraviolet CVD, the method comprising the steps of:

placing a wafer in a vacuum chamber having a window;

causing a first gas or source gas that contains silicon to flow through the vacuum chamber;

exposing the wafer to light emitted from an excimer lamp through the window; and maintaining an atmosphere in the chamber at a temperature lower than 350° C. to form an SiOCH film on the wafer.

The method may further include adding a second gas or additional gas to the first gas, the second gas containing oxygen atoms therein.

The method may further include elevating a temperature of atmosphere in the chamber with the film remaining in the chamber after forming the film in an environment of the first and second gases.

The method may further include stopping supplying oxygen after forming the film in an environment of the first and second gases and then further forming the film in the environment of TEOS alone.

The method may, further include maintaining the wafer at a temperature in the range from 25 to 350° C. when the film is formed after forming the film in an environment of the first and second gases.

The method further includes:

adding a second gas to the first gas, the additional gas containing oxygen atoms therein;

stopping supplying oxygen to the chamber after a certain length of time; and elevating the film in the chamber to be exposed to vacuum ultraviolet.

The method further includes:

adding a second gas to the first gas, the second gas containing oxygen atoms therein;

stopping supplying the second gas to chamber after a certain length of time; and elevating temperature of atmosphere in the chamber with the film remaining in the chamber to be exposed to vacuum ultraviolet while the temperature is being elevated.

Further scope of applicability of the present invention will become apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become fully understood from the detailed description given hereinbelow and the accompanying drawings which are given by way of illustration only, and thus are not limitative of the present invention, and wherein:

FIG. 5 illustrates an SEM photograph of an interlayer dielectric film according to the fifth embodiment.

DETAILED DESCRIPTION OF THE INVENTION

The present invention will be described in detail with reference to the accompanying drawings.

First Embodiment

Figure 1:
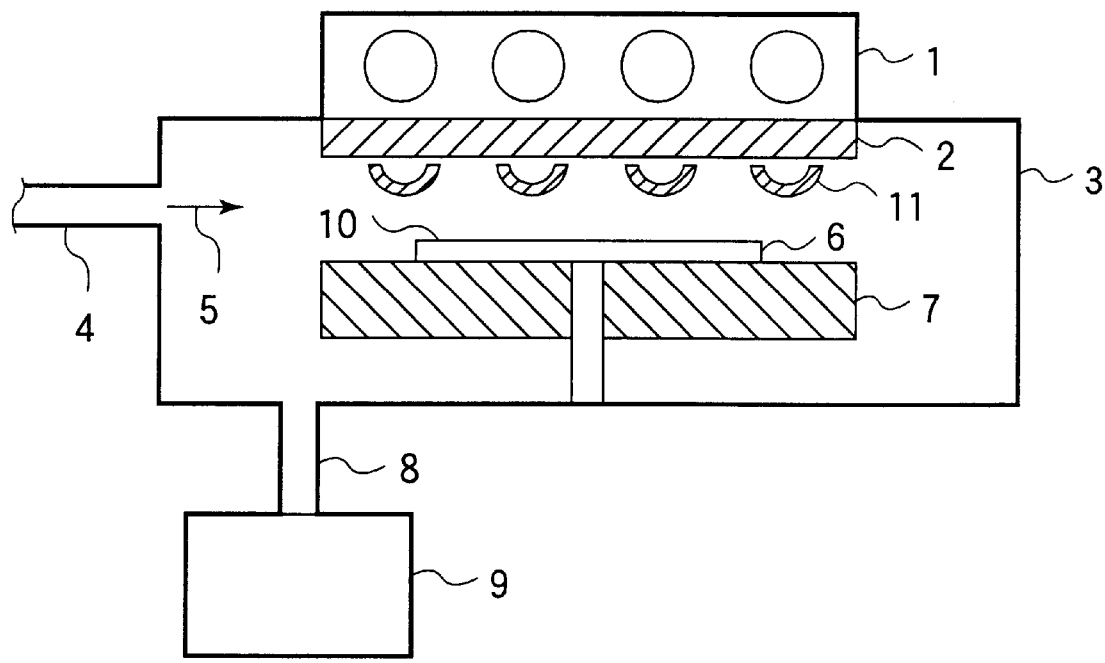
FIG. 1 is a cross-sectional view of a vacuum ultraviolet CVD apparatus.

FIG. 1 is a cross-sectional view of a vacuum ultraviolet CVD apparatus.

Referring to FIG. 1, an Xe$_2$ excimer lamp 1 is mounted above the vacuum chamber 3 with a synthetic quartz window 2 disposed therebetween. TEOS (tetra ethyl ortho silicate) as a material gas or source gas 5 is introduced into the vacuum chamber 3 so that vacuum ultraviolet 11 illuminates an insulating film 10 on a 6-in. wafer 6 placed on a susceptor 7 to form an interlayer dielectric film on the wafer 6.

The Xe$_2$ excimer lamp 1 was turned on and vaporized TEOS (Si (OC$_2$H$_5$)$_4$) was introduced into the vacuum chamber 3 with oxygen $O_2$ (i.e., added gas) added to TEOS, thereby forming an interlayer dielectric film on the silicon wafer 6. The process was carried out for 15 minutes. The flow rate of TEOS was 100 sccm. The pressure (partial pressure) of TEOS was 300 mTorr. The temperature of the wafer 6 was room temperature. Light intensity was 12 mW/cm2 immediately below the 20-mm thick synthetic quartz window 2. The process can be carried out even at temperatures below zero degrees but room temperature is preferred since no extra energy or a special apparatus is required when the process is carried out at room temperature.

The wafer 6 was disposed 15 mm below the synthetic quartz window 2. The light intensity under the synthetic quartz window 2 was measured by using a light meter (UIT-150/VUVS-172, manufactured by Ushio Denki).

Figure 2:
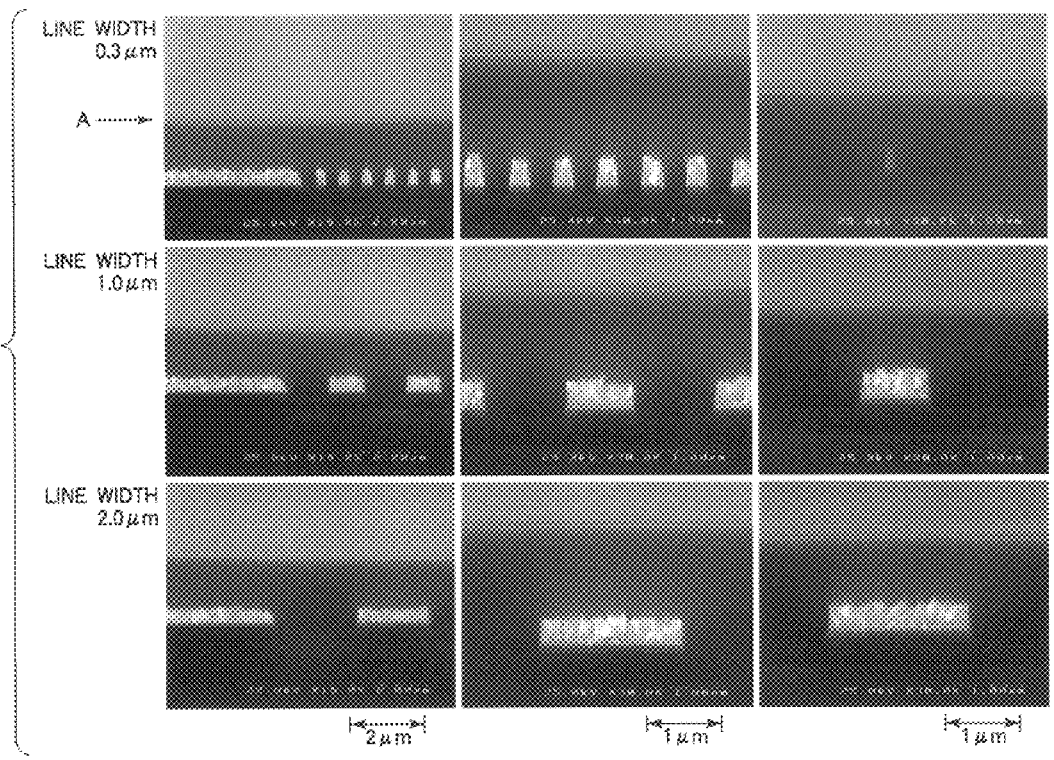
FIG. 2 shows stepped portions photographed with a SEM (scanning electron microscope, the Hitachi Denshi S4000)

FIG. 2 is a cross-sectional view showing stepped portions photographed with a SEM (scanning electron microscope, the Hitachi Denshi S4000). FIG. 2 illustrates images on the left, middle, and right column with magnifications of 15,00 times, 30,000 times, and 30,000 times, respectively. "Line Width" represent the width of a tungsten connection (wire). In the image on the upper left corner, an arrow A points to a top surface of the interlayer dielectric film. White portions are tungsten connections. It should be noted that the insulating film well fills up spaces between adjacent tungsten connections.

The stepped pattern is a tungsten connection having a height of 0.50 $\mu$m. As is apparent from FIG. 2, the stepped portions spaced apart by 0.30–2.0, $\mu$m are filled with the insulating film such that the top surface of the insulating film is very flat. Thus, the method can be used to form an interlayer dielectric film.

Second Embodiment

In the first embodiment, oxygen was added to TEOS. The resulting interlayer dielectric film contains a very large amount of OH group, so that the film is thick and may shrink enough to create cracks therein due to the difference in stress between the interlayer dielectric film and the structure immediately under the interlayer dielectric film.

A flat insulating film was formed using TEOS with oxygen O2 added to TEOS just as mentioned in the first embodiment. Then, the supply of TEOS and oxygen $O_2$ to the chamber 3 was stopped with the wafer 6 remaining therein. Then, the temperature of atmosphere in the chamber is slowly increased to about 200° C., the wafer 6 remaining in a vacuum or nitrogen gas $N_2$ being introduced into the chamber so that OH groups are released from the interlayer dielectric film.

Figure 3:
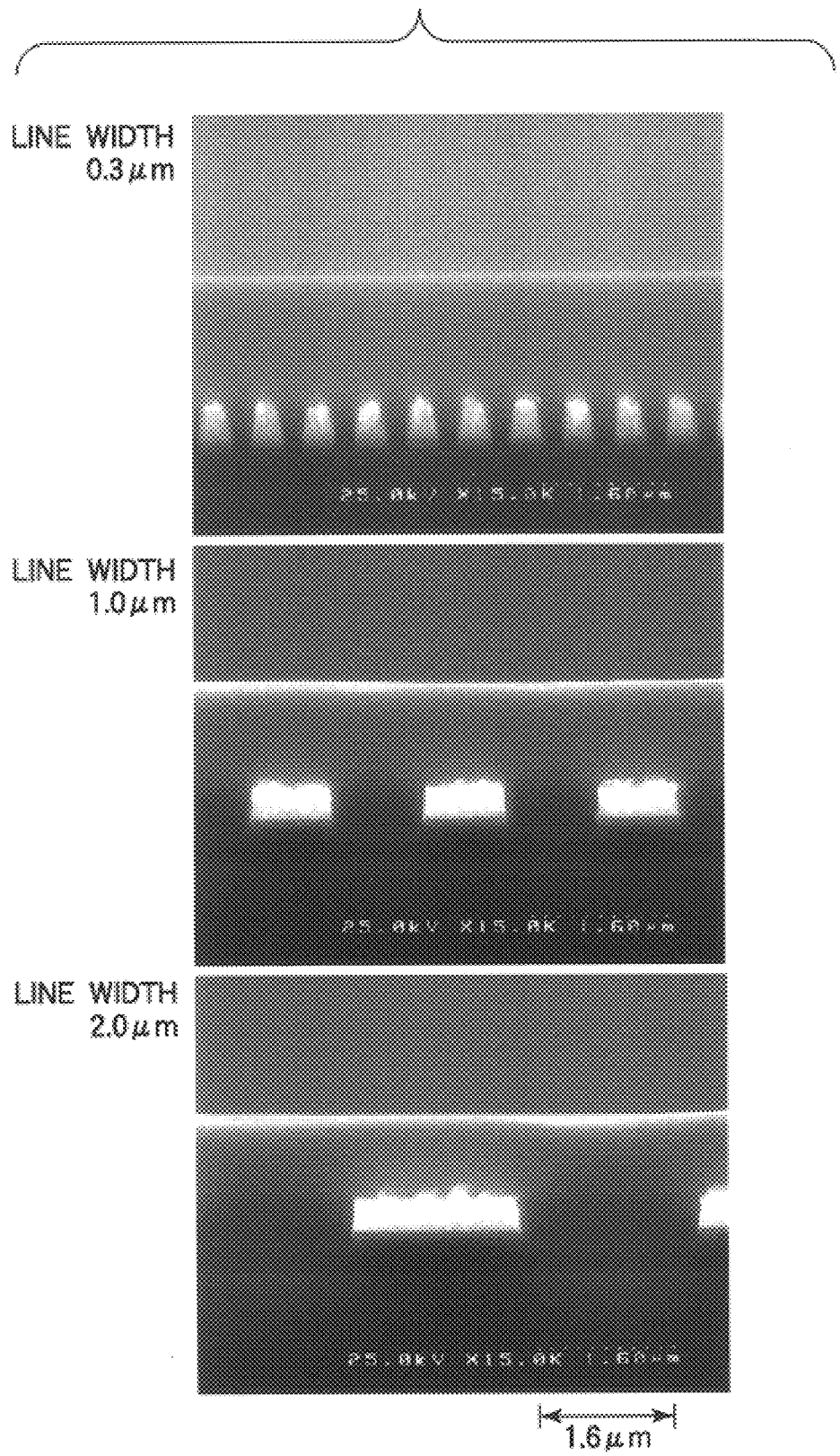
FIG. 3 illustrates an SEM photograph of an interlayer dielectric film according to the second embodiment.

FIG. 3 is a cross-sectional view showing photographs of an interlayer dielectric film according to the second embodiment, taken with an SEM. FIG. 3 illustrates images with magnification of 15,000 times.

As is clear from FIG. 3, cracks did not occur and an interlayer dielectric film having a good flatness can be formed.

Third Embodiment

Just as in the first embodiment, a flat insulating film was formed using TEOS with oxygen $O_2$ added to TEOS. Then, the supply of TEOS and oxygen $O_2$ to the chamber was stopped with the wafer 6 remaining therein. Then, the process further carried out using TEOS alone.

Figure 4:
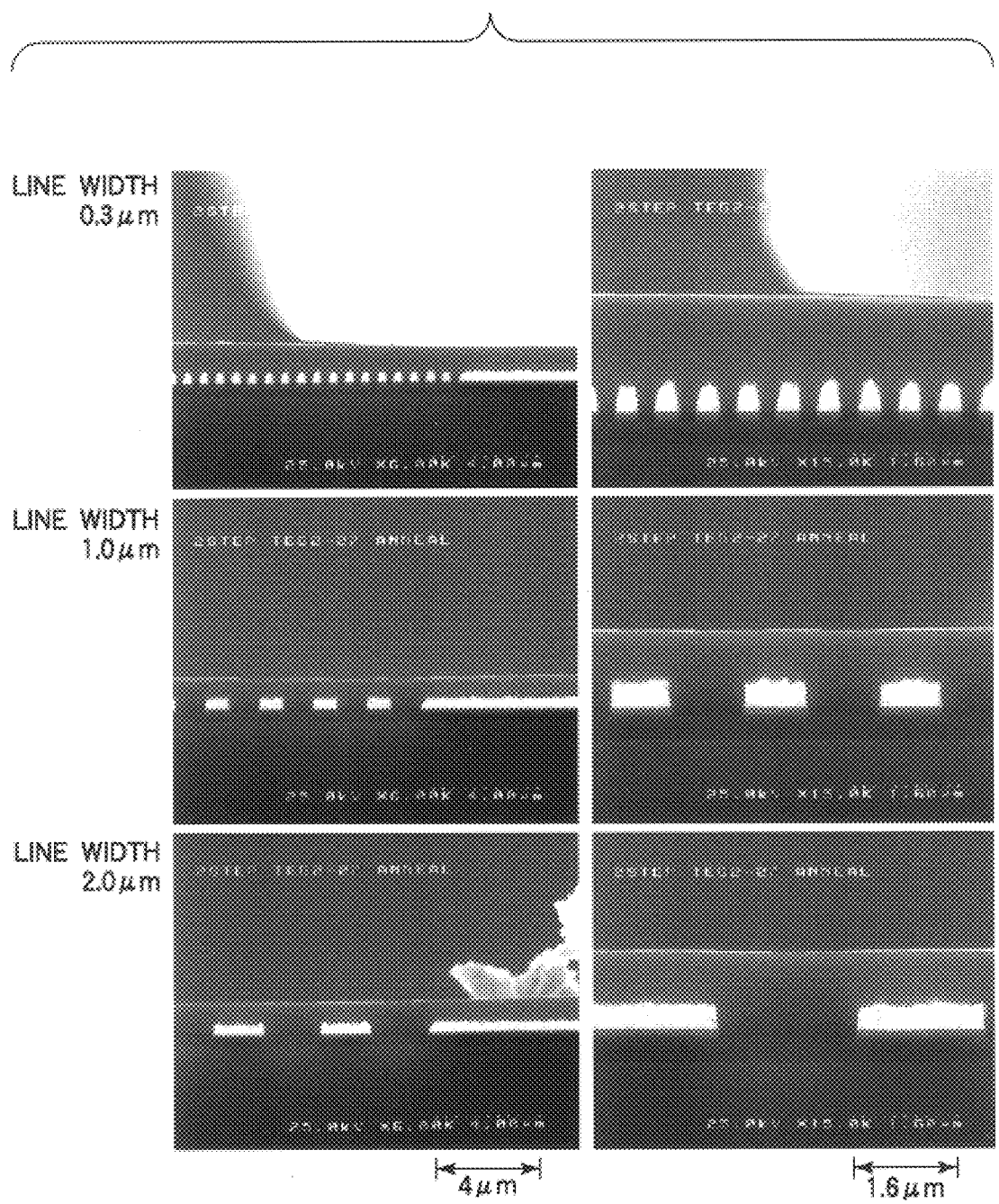
FIG. 4 illustrates an SEM photograph of an interlayer dielectric film according to the third embodiment.

FIG. 4 is a cross-sectional view showing photographs of an interlayer dielectric film according to the third embodiment, taken with an SEM. FIG. 4 illustrates images at the left and right columns with magnifications of 6,000 times and 15,000 times, respectively.

As is clear from FIG. 4, for example, cracks did not occur and the method can be used to form an interlayer dielectric film having a good flatness since TEOS that does not contain OH groups provides a capping effect.

Fourth Embodiment

The fourth embodiment is characterized in that the susceptor 7 is maintained at a temperature higher than 100° C. and a flat insulating film is formed by using TEOS and oxygen $O_2$. Temperatures higher than 100° C. cause OH group contained within the film to escape and therefore, no defects such as cracks do not occur.

Fifth Embodiment

In a fifth embodiment, an interlayer dielectric film is formed in an environment of TEOS to which a gas that contains oxygen is added. Then, the supply of TEOS and the gas that contains oxygen is stopped and the film is exposed to ultraviolet in a vacuum with the film remaining in the chamber. This changes the property of the film surface such that the film becomes difficult to be degassed. Thus, for example, cracks do not occur. Further, the same advantage can also be obtained in synergy with the second embodiment by elevating the temperature of the film while the film is exposed to ultraviolet in a vacuum environment.

FIG. 5 is a cross-sectional view showing photographs of an interlayer dielectric film according to the fifth embodiment, taken with an SEM. FIG. 5 illustrates images on the left and right column with magnifications of 6,000 times and 15,000 times, respectively.

As described above, the present invention provides a method in which an interlayer dielectric film having a very flat surface is formed at a temperature below 350° C. by a vacuum ultraviolet CVD using an organic source gas such as TEOS that contains silicon Si.

In other words, no special energy other than the energy of light is required to form the film and the film can be formed even at room temperature. The method includes the following distinct variations.

① An insulating film is formed in an environment of TEOS to which a gas that contains oxygen O is added.

② An insulating film is formed in an environment of TEOS to which a gas that contains oxygen is added. Then, the supply of TEOS and the gas that contains oxygen is stopped, and the temperature of atmosphere in the chamber is elevated with the film remaining in the chamber.

③ An insulating film is formed in an environment of TEOS to which a gas that contains oxygen is added. Then, the gas that contains oxygen O is stopped and the film is further processed in the environment of TEOS alone.

④ An insulating film is formed in an environment of TEOS to which a gas that contains oxygen is added. Then, the wafer 6 is maintained at a temperature at which OH groups are released, or higher, i.e., in the range from 100° C. to 350° C. In other words, the film is formed at a temperature at which OH groups can be removed so that the resultant film does not contain OH groups that cause, for example, cracks.

⑤ An insulating film is formed in an environment of TEOS to which a gas that contains oxygen is added. Then, the supply of TEOS and the gas that contains oxygen is stopped. Then, the film is left in the chamber and is exposed to vacuum ultraviolet, or the temperature of the atmosphere in the chamber is elevated while the film is being exposed to vacuum ultraviolet.

Applications of the Invention

The invention can find a variety of applications including isolation between elements and insulation between elements. The method can be applied to the formation of an Si oxide that uses a siloxane material.

The present invention is not limited to the aforementioned embodiments and a variety of modifications can be made without departing from the scope of the invention.

What is claimed is:

1. A method of manufacturing an interlayer dielectric film by vacuum ultraviolet CVD, comprising the steps of:

placing a wafer in a vacuum chamber having a window;

causing a first gas that contains silicon atoms to flow through the vacuum chamber;

exposing the wafer to light emitted from a $Xe_2$ excimer lamp through the window; and maintaining an atmosphere in the chamber at a first temperature which is less than 350° C. to form an insulating film on the wafer which substantially fills stepped portions of the wafer to provide step coverage and which has a substantially flat top surface.

2. The method according to claim 1, wherein the first gas is an organic source gas that contains oxygen atoms.

3. The method according to claim 2, wherein the organic source gas is tetra ethyl ortho silicate.

4. The method according to claim 1, wherein the atmosphere in the chamber is maintained at room temperature.

5. The method according to claim 1, further comprising the step of:

adding a second gas to the first gas, the second gas containing oxygen atoms therein.

6. The method according to claim 5, further comprising the step of:

heating the atmosphere in the chamber to a second temperature which is greater than the first temperature, using a heating means, while the insulating film remains in the chamber.

7. The method according to claim 1, further comprising the steps of:

adding a second gas to the first gas, the second gas containing oxygen atoms therein; and stopping oxygen supply after a preselected length of time; and further forming the insulating film in an environment in which the first gas is tetra ethyl ortho silicate alone.

8. The method according to claim 1, further comprising the steps of:

adding a second gas to the first gas, the second gas containing oxygen atoms therein; and maintaining the wafer at a temperature at which the insulating film is formed at a temperature at which OH groups can be removed.

9. The method according to claim 1, further comprising the steps of:

adding a second gas to the first gas, the second gas containing oxygen atoms therein;

stopping supplying the second gas to the chamber; and letting the film remain in the chamber to be exposed to vacuum ultraviolet.

10. The method according to claim 1, further comprising:

adding a second gas to the first gas, the second gas containing oxygen atoms therein;

stopping oxygen supply to the chamber; and heating the atmosphere in the chamber to a second temperature which is greater than the first temperature, using a heating means, while the insulating film remains in the chamber, wherein the insulating film is exposed to the vacuum ultraviolet during heating to the second temperature.

11. The method according to claim 1, wherein the insulating layer is the interlayer dielectric film and is comprised of a single layer.

* * * * *